United States Patent
Lee et al.

(10) Patent No.: US 11,765,891 B2
(45) Date of Patent: Sep. 19, 2023

(54) ONE-TIME PROGRAMMABLE (OTP) MEMORY CELL AND FABRICATION METHOD THEREOF

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Chun-Hsien Lin, Tainan (TW); Yung-Chen Chiu, Taichung (TW); Chien-Liang Wu, Tainan (TW); Te-Wei Yeh, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 268 days.

(21) Appl. No.: 17/391,067

(22) Filed: Aug. 2, 2021

(65) Prior Publication Data
US 2023/0015480 A1      Jan. 19, 2023

(30) Foreign Application Priority Data
Jul. 14, 2021   (CN) .......................... 202110794744.5

(51) Int. Cl.
*H10B 20/20*      (2023.01)
*H10B 20/25*      (2023.01)

(52) U.S. Cl.
CPC ............. *H10B 20/20* (2023.02); *H10B 20/25* (2023.02)

(58) Field of Classification Search
CPC ...... H10B 20/20; H10B 20/25; H01L 23/5252
See application file for complete search history.

(56) References Cited

U.S. PATENT DOCUMENTS

| | | | |
|---|---|---|---|
| 4,823,181 A | 4/1989 | Mohsen | |
| 5,019,878 A | 5/1991 | Yang | |
| 7,511,982 B2 | 3/2009 | Kurjanowicz | |
| 9,129,687 B2 | 9/2015 | Kurjanowicz | |
| 9,929,090 B2* | 3/2018 | Chang | G11C 17/165 |
| 9,929,091 B2* | 3/2018 | Li | H01L 27/0886 |
| 10,127,993 B2* | 11/2018 | Chung | G11C 17/18 |
| 2014/0021581 A1 | 1/2014 | Yang | |
| 2017/0154686 A1 | 6/2017 | Liaw | |
| 2020/0075610 A1 | 3/2020 | Wu | |

FOREIGN PATENT DOCUMENTS

JP        8-316324 A      11/1996

* cited by examiner

*Primary Examiner* — Allison Bernstein
(74) *Attorney, Agent, or Firm* — Winston Hsu (57) ABSTRACT

A one-time programmable (OTP) memory cell includes a substrate having a first conductivity type and having an active area surrounded by an isolation region, a transistor disposed on the active area, and a capacitor disposed on the active area and electrically coupled to the transistor. The capacitor comprises a diffusion region of a second conductivity type in the substrate, a metallic film in direct contact with the active area, a capacitor dielectric layer on the metallic film, and a metal gate surrounded by the capacitor dielectric layer. The diffusion region and the metallic film constitute a capacitor bottom plate.

20 Claims, 6 Drawing Sheets

ONE-TIME PROGRAMMABLE (OTP) MEMORY CELL AND FABRICATION METHOD THEREOF

BACKGROUND OF THE INVENTION

1. Field of the Invention

The present invention relates to the field of semiconductor technology, in particular to a one-time programmable (OTP) memory cell and a method for manufacturing the same.

2. Description of the Prior Art

With the growth of solid-state non-volatile memories (NVM) in storing configuration settings, program code, application parameters and data in consumer, industrial and automotive electronics, demand for embedded NVM is rapidly increasing.

Figure 1:
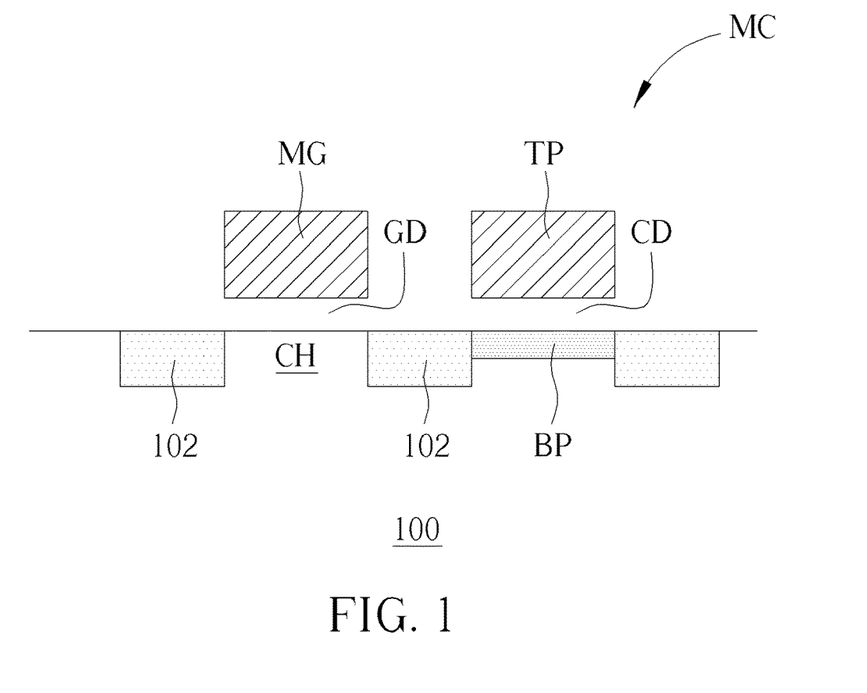
FIG. 1 illustrates a schematic cross-sectional view of an OTP memory cell with a single transistor and a single capacitor.

An anti-fuse variable one-time programmable (OTP) memory cell has been developed due to its non-volatility and compatibility with logic processes. FIG. 1 illustrates a schematic cross-sectional view of an OTP memory cell MC with a single transistor and a single capacitor (1T1C). As shown in FIG. 1, the 1T1C OTP memory cell MC includes a transistor T and a capacitor C. The transistor T includes doped regions 102 and 104 located in the substrate 100, a channel region CH between the doped regions 102 and 104, a gate MG on the channel region CH, and a gate dielectric layer GD between the gate MG and the channel region CH. The capacitor C includes a diffusion bottom plate BP connected to the doped region 104, a metal electrode top plate TP, and a capacitor dielectric layer CD between the diffusion bottom plate BP and the metal electrode top plate TP.

In the above-mentioned existing OTP memory cell structure, the gate dielectric layer GD is usually composed of a thick silicon oxide layer (the thickness of which is equal to the thickness of the gate oxide layer of an input/output (I/O) device) and a high dielectric constant (high-k) film. The capacitor dielectric layer CD is usually composed of a thin silicon oxide layer (the thickness of which is equal to the thickness of the gate oxide layer of a logic core device) and a high-k film.

One disadvantage of the above-mentioned existing OTP memory cell structure is that in order to avoid leakage, the high-k film of the capacitor dielectric layer CD needs to have a sufficient thickness. However, a too thick high-k film reduces the program performance of the OTP memory cell MC. Another disadvantage of the above-mentioned existing structure is that the capacitance value is not easy to further increase.

SUMMARY OF THE INVENTION

It is one object of the present invention to provide an improved one-time programmable (OTP) memory cell and a method for forming the same in order to solve the deficiencies or shortcomings of the prior art.

One aspect of the invention provides a one-time programmable (OTP) memory cell including a substrate having a first conductivity type and an active area surrounded by an isolation region, a transistor disposed on the active area, and a capacitor disposed on the active area and electrically coupled to the transistor. The capacitor comprises a diffusion region of a second conductivity type in the substrate, a metallic film in direct contact with the active area, a capacitor dielectric layer on the metallic film, and a metal gate surrounded by the capacitor dielectric layer. The diffusion region and the metallic film constitute a capacitor bottom plate.

According to some embodiments, the transistor comprises a source region of the second conductivity type in the substrate, a drain region of the second conductivity type in the substrate, a channel region in the substrate and between the source region and the drain region, and a gate electrode over the channel region.

According to some embodiments, the drain region is electrically coupled to a bit line, the gate electrode is electrically coupled to a word line, and the metal gate is electrically coupled to a source line.

According to some embodiments, the diffusion region is contiguous with the source region.

According to some embodiments, the transistor further comprises a silicon oxide layer and a first high dielectric constant film between the channel region and the gate electrode.

According to some embodiments, the gate electrode comprises metal.

According to some embodiments, the metallic film has a U-shaped profile and surrounds the capacitor dielectric layer and the metal gate.

According to some embodiments, the metallic film comprises titanium nitride.

According to some embodiments, the capacitor dielectric layer comprises a second high dielectric constant film.

According to some embodiments, the second high dielectric constant film is in direct contact with the metallic film.

Another aspect of the invention provides a method of forming a one-time programmable (OTP) memory cell. A substrate having a first conductivity type and comprising an active area surrounded by an isolation region is provided. A transistor is formed on the active area. A capacitor is formed on the active area. The capacitor is electrically coupled to the transistor and comprises a diffusion region of a second conductivity type in the substrate, a metallic film in direct contact with the active area, a capacitor dielectric layer on the metallic film, and a metal gate surrounded by the capacitor dielectric layer.

According to some embodiments, the transistor comprises a source region of the second conductivity type in the substrate, a drain region of the second conductivity type in the substrate, a channel region in the substrate and between the source region and the drain region, and a gate electrode over the channel region.

According to some embodiments, the drain region is electrically coupled to a bit line, the gate electrode is electrically coupled to a word line, and the metal gate is electrically coupled to a source line.

According to some embodiments, the diffusion region is contiguous with the source region.

According to some embodiments, the transistor further comprises a silicon oxide layer and a first high dielectric constant film between the channel region and the gate electrode.

According to some embodiments, the gate electrode comprises metal.

According to some embodiments, the metallic film has a U-shaped profile and surrounds the capacitor dielectric layer and the metal gate.

According to some embodiments, the metallic film comprises titanium nitride.

According to some embodiments, the capacitor dielectric layer comprises a second high dielectric constant film.

According to some embodiments, the high dielectric constant film is in direct contact with the metallic film.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 2:
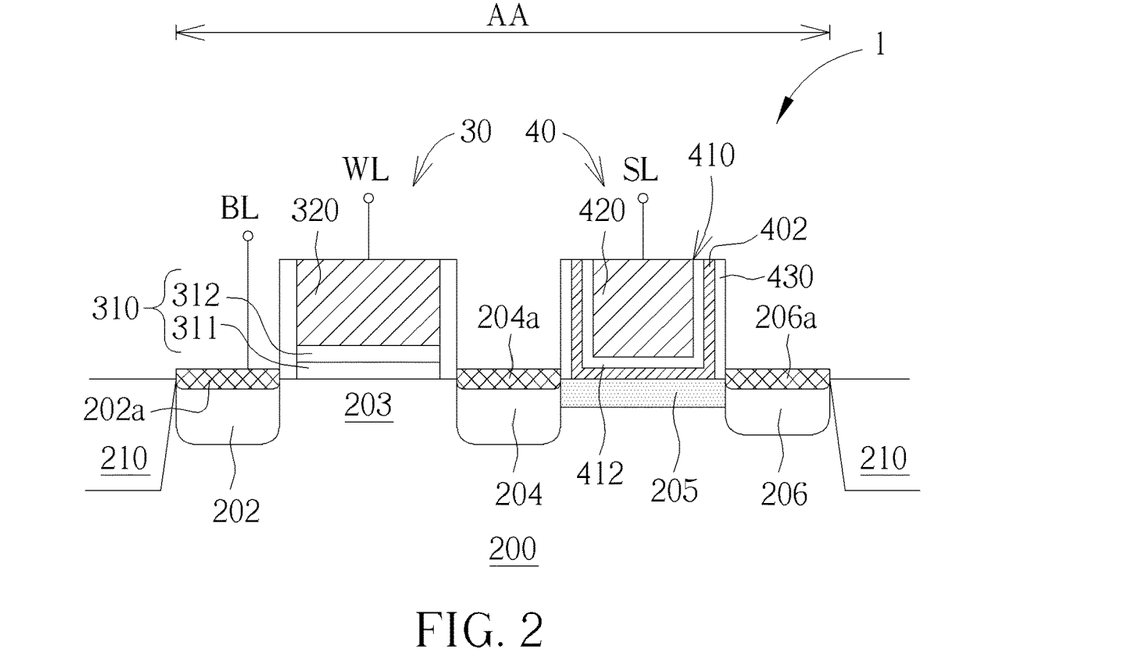
FIG. 2 is a schematic cross-sectional view of an OTP memory cell according to an embodiment of the present invention.

Please refer to FIG. 2, which is a schematic cross-sectional view of a one-time programmable (OTP) memory cell 1 according to an embodiment of the present invention. As shown in FIG. 2, the OTP memory cell 1 includes a substrate 200, for example, a silicon substrate. The substrate 200 may have a first conductivity type, for example, a P type. The OTP memory cell 1 is formed in the active area AA surrounded by the isolation region 210. According to an embodiment of the present invention, the OTP memory cell 1 includes a transistor 30, for example, an NMOS transistor, which is disposed in the active area AA. According to an embodiment of the present invention, the OTP memory cell 1 further includes a capacitor 40 disposed on the active area AA and electrically coupled to the transistor 30.

According to an embodiment of the present invention, the transistor 30 includes a drain region 202 located in the substrate 200 and having a second conductivity type (for example, N-type), a source region 204 located in the substrate 200 and having the second conductivity type (for example, N-type), a channel region 203 located in the substrate 200 and between the drain region 202 and the source region 204, and a gate electrode 320 on the channel region 203.

According to an embodiment of the present invention, the transistor 30 further includes a gate dielectric layer 310 located between the channel region 203 and the gate electrode 320. According to an embodiment of the present invention, the gate dielectric layer 310 includes a silicon oxide layer 311 and a first high dielectric constant (high-k) film 312. According to an embodiment of the present invention, the silicon oxide layer 311 is disposed under the first high-k film 312 and directly contacts a surface of the substrate 200. According to an embodiment of the present invention, the first high-k film 312 is in direct contact with the gate electrode 320.

According to an embodiment of the present invention, the gate electrode 320 may include metal, for example, titanium, titanium nitride, tantalum, tantalum nitride, tungsten, aluminum, or any combination thereof, but is not limited thereto. According to an embodiment of the present invention, a spacer 330 may be formed on a sidewall of the gate electrode 320.

According to an embodiment of the present invention, the capacitor 40 includes a diffusion region 205 of the second conductivity type (for example, N-type) located in the substrate 200. The diffusion region 205 may be located between the source region 204 and another doped region 206. According to an embodiment of the present invention, the diffusion region 205 is connected to the source region 204. The capacitor 40 further includes a metallic film 402 directly contacting the surface of the substrate 200 in the active area AA, a capacitor dielectric layer 410 located on the metallic film 402, and a metal gate 420 surrounded by the capacitor dielectric layer 410. The metallic film 402 directly contacts the diffusion region 205. The diffusion region 205 and the metallic film 402 together constitute a capacitor bottom plate. According to an embodiment of the present invention, the metal gate 420 may include metal, for example, titanium, titanium nitride, tantalum, tantalum nitride, tungsten, aluminum, or any combination thereof, but is not limited thereto.

According to an embodiment of the present invention, the drain region 202 is electrically connected to a bit line BL, the gate electrode 320 is electrically connected to a word line WL, and the metal gate 420 is electrically connected to a source line SL. According to an embodiment of the present invention, metal silicide layers 202a, 204a, and 206a, such as titanium silicide, nickel silicide, or the like, may be formed on the drain region 202, the source region 204, and the doped region 206, respectively.

According to an embodiment of the present invention, the metallic film 402 of the capacitor 40 has a U-shaped profile and surrounds the capacitor dielectric layer 410 and the metal gate 420. The capacitor dielectric layer 410 is formed on an inner surface of the metallic film 402. A spacer 430 may be formed on the outer surface of the metallic film 402. According to an embodiment of the present invention, for example, the metallic film 402 may include titanium nitride, but is not limited thereto.

According to an embodiment of the present invention, the capacitor dielectric layer 410 includes a second high-k film 412. The composition of the second high-k film 412 may be different from that of the first high-k film 312. According to an embodiment of the present invention, the thickness of the second high-k film 412 may be different from the thickness of the first high-k film 312. For example, the thickness of the second high-k film 412 is greater than the thickness of the first high-k film 312.

According to an embodiment of the present invention, the dielectric constant of the second high-k film 412 may be different from the dielectric constant of the first high-k film 312. For example, the dielectric constant of the second high-k film 412 is higher than the dielectric constant of the first high-k film 312. According to an embodiment of the present invention, the capacitor dielectric layer 410 does not include a silicon oxide layer. According to an embodiment of the present invention, the second high-k film 412 is in direct contact with the metallic film 402.

According to an embodiment of the present invention, the first high-k film 312 may include one or more high-k dielectric materials (or one or more layers of high-k dielectric materials), such as hafnium silicon oxide (HfSiO), hafnium oxide (HfO$_2$), aluminum oxide (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$) and/or other suitable high-k dielectric materials.

According to an embodiment of the present invention, the second high-k film 412 may include one or more high-k dielectric materials (or one or more layers of high-k dielectric materials), such as hafnium silicon oxide, hafnium oxide, aluminum oxide, zirconium oxide, lanthanum oxide, titanium oxide, yttrium oxide, strontium titanate and/or other suitable high-k dielectric materials.

One technical feature of the present invention is that the diffusion region 205 and the metallic film 402 together constitute a capacitor bottom plate, and the metallic film 402 has a novel U-shaped cross-sectional profile, which effectively increases the capacitance value of the capacitor 40. In addition, in an embodiment, the capacitor dielectric layer 410 between the metal gate 420 and the metallic film 402 may only include the second high-k film 412, which solves the problem of reduced program performance of the OTP memory cell according to the prior art.

Another aspect of the present invention provides a method for forming a one-time programmable memory cell 1. A substrate 200 having a first conductivity type and an active area AA surrounded by an isolation area 210 is provided. A transistor 30 and a capacitor 40 are formed on the active area AA. The capacitor 40 is electrically coupled to the transistor 30. The capacitor 40 includes a diffusion region 205 of the second conductivity type located in the substrate 200, a metallic film 402 directly contacting the diffusion region 205, a capacitor dielectric layer 410 on the metallic film 402, and a metal gate 420 surrounded by the capacitor dielectric layer 410.

According to an embodiment of the present invention, the transistor 30 includes a drain region 202 and a source region 204 located in the substrate 200 and having the second conductivity type, and a channel region 203 located in the substrate 200 and between the source region 204 and the drain region 202, and a gate electrode 320 on the channel region 203. According to an embodiment of the present invention, the drain region 202 is electrically connected to a bit line BL, the gate electrode 320 is electrically connected to a word line WL, and the metal gate 420 is electrically connected to a source line SL. According to an embodiment of the present invention, the diffusion region 205 is connected to the source region 204. According to an embodiment of the present invention, the transistor 30 further includes a silicon oxide layer 311 and a first high-k film 312 between the channel region 203 and the gate electrode 320. According to an embodiment of the present invention, the gate electrode 320 includes metal.

According to an embodiment of the present invention, the metallic film 402 has a U-shaped profile and surrounds the capacitor dielectric layer 410 and the metal gate 420. According to an embodiment of the present invention, the metallic film 402 includes titanium nitride. According to an embodiment of the present invention, the capacitor dielectric layer 410 includes a second high-k film 412. According to an embodiment of the present invention, the second high-k film 412 is in direct contact with the metallic film 402.

Figure 3:
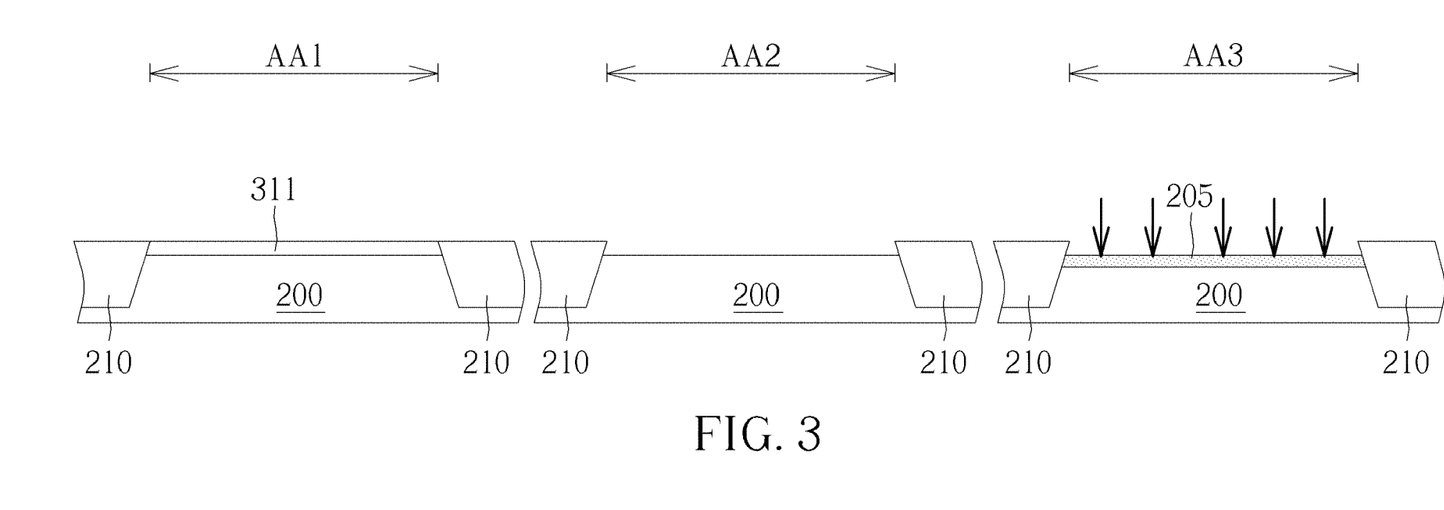
FIG. 3 to FIG. 11 illustrate an exemplary method of forming a capacitor of the OTP memory cell compatible with the fabrication process of the input and output (I/O) devices and the core circuit devices.

Please refer to FIG. 3 to FIG. 11, which illustrate an exemplary method of forming a capacitor of the OTP memory cell compatible with the fabrication process of the input and output (I/O) devices and the core circuit devices, wherein like regions, layers or elements are designated by like numeral numbers or labels. As shown in FIG. 3, an isolation region 210 is formed on the substrate 200, for example, a shallow trench isolation (STI) structure, which defines an active area AA1, an active area AA2, and an active area AA3. According to an embodiment of the present invention, the substrate 200 may be a P-type silicon substrate, but is not limited thereto. A thick silicon oxide layer 311 is formed on the surface of the substrate 200 in the active area AA1. A diffusion region 205 is formed on the surface of the substrate 200 in the active area AA3 by ion implantation.

According to an embodiment of the present invention, a I/O devices is to be formed in the active area AA1, a core circuit device is to be formed in the active area AA2, and a capacitor of the OTP memory cell is to be formed in the active area AA3.

It is to be understood that the transistor electrically coupled with the capacitor of the OTP memory cell may have the same structure as the I/O device in the active area AA1 (for example, when the OTP memory cell adopts the 1T1C architecture). Alternatively, the transistor electrically coupled with the capacitor of the OTP memory cell may have the same structure as the core circuit device in the active area AA2 (for example, when the OTP memory cell adopts the 2T1C architecture). To simplify the description, the transistor electrically coupled with the capacitor of the OTP memory cell is not shown in the active area AA3.

Figure 4:
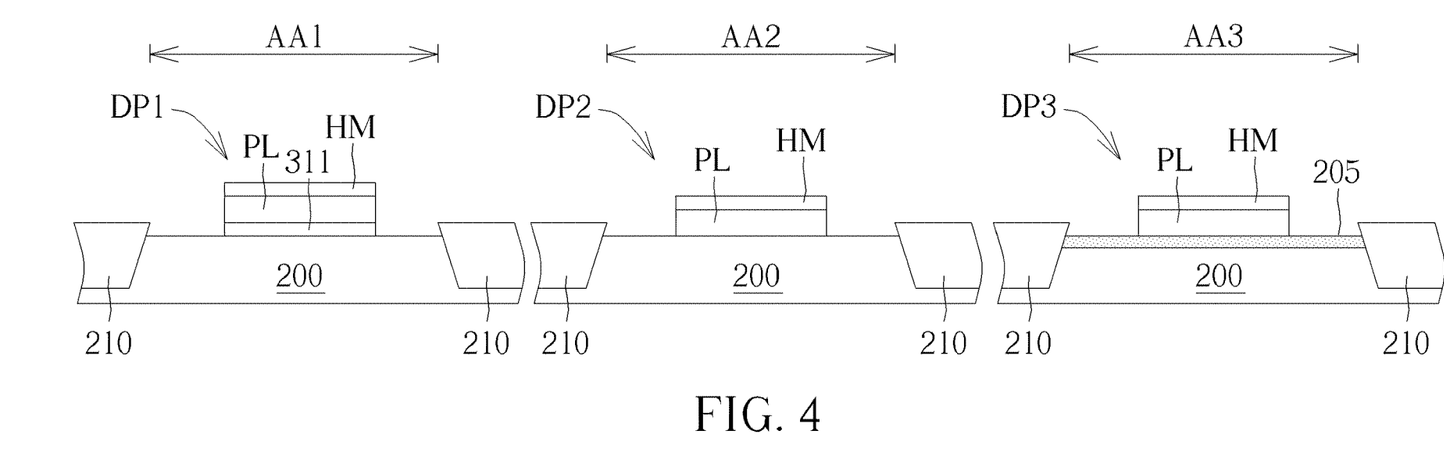

As shown in FIG. 4, using processes such as deposition, lithography, and etching, dummy gate DP1, dummy gate DP2, and dummy gate DP3 are formed in active area AA1, active area AA2, and active area AA3, respectively. The dummy gate DP1 includes a patterned hard mask layer HM, a polysilicon layer PL, and a silicon oxide layer 311. The dummy gate DP2 and the dummy gate DP3 include a patterned hard mask layer HM and a polysilicon layer PL.

Figure 5:
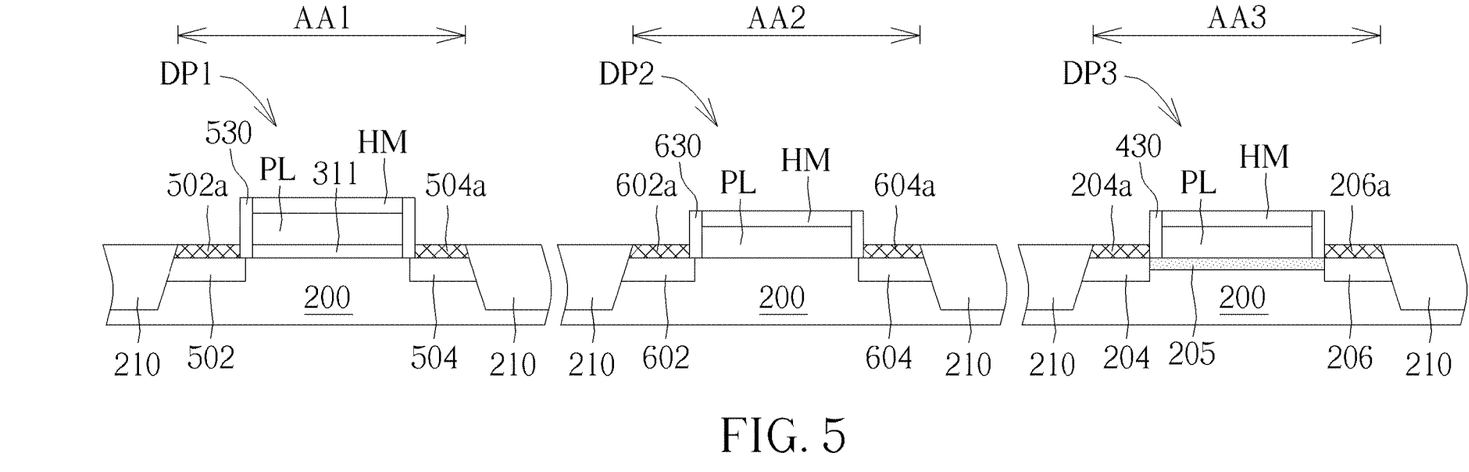

As shown in FIG. 5, by using deposition and etching processes, spacers 530, 630, and 430 are formed on the sidewalls of the dummy gate DP1, the dummy gate DP2, and the dummy gate DP3, respectively. According to an embodiment of the present invention, the spacers 530, 630, and 430 may be silicon nitride spacers, but are not limited thereto. An ion implantation process is then used to form doped regions 502, 504, 602, 604, 204, and 206 in the substrate 200 and adjacent the spacers 530, 630, and 430. A metal silicide process is then performed to form metal silicide layers 502a, 504a, 602a, 604a, 204a, and 206a on the doped regions 502, 504, 602, 604, 204, and 206, respectively.

Figure 6:
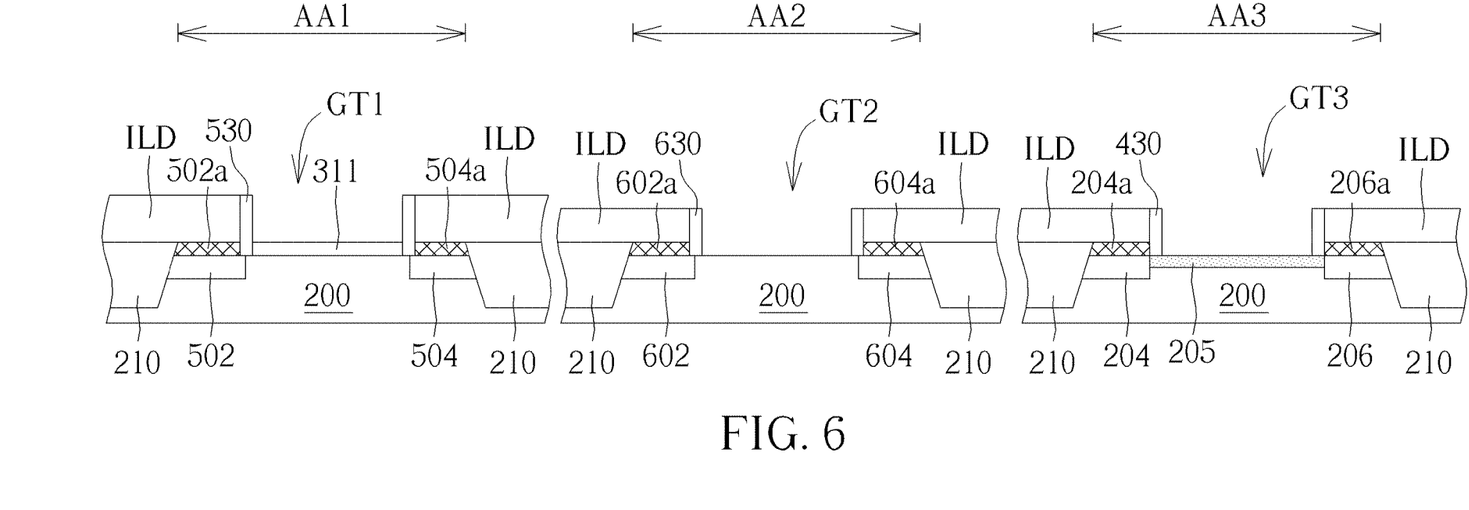

As shown in FIG. 6, a dielectric layer ILD is deposited on the substrate 200, and a chemical mechanical polishing process is performed to polish the dielectric layer ILD until the dummy gate DP1, the dummy gate DP2, and the dummy gate DP3 are exposed. Subsequently, the hard mask layer HM and the polysilicon layer PL of the dummy gate DP1, the dummy gate DP2, and the dummy gate DP3 are removed, thereby forming gate trenches GT1, GT2, and GT3.

Figure 7:
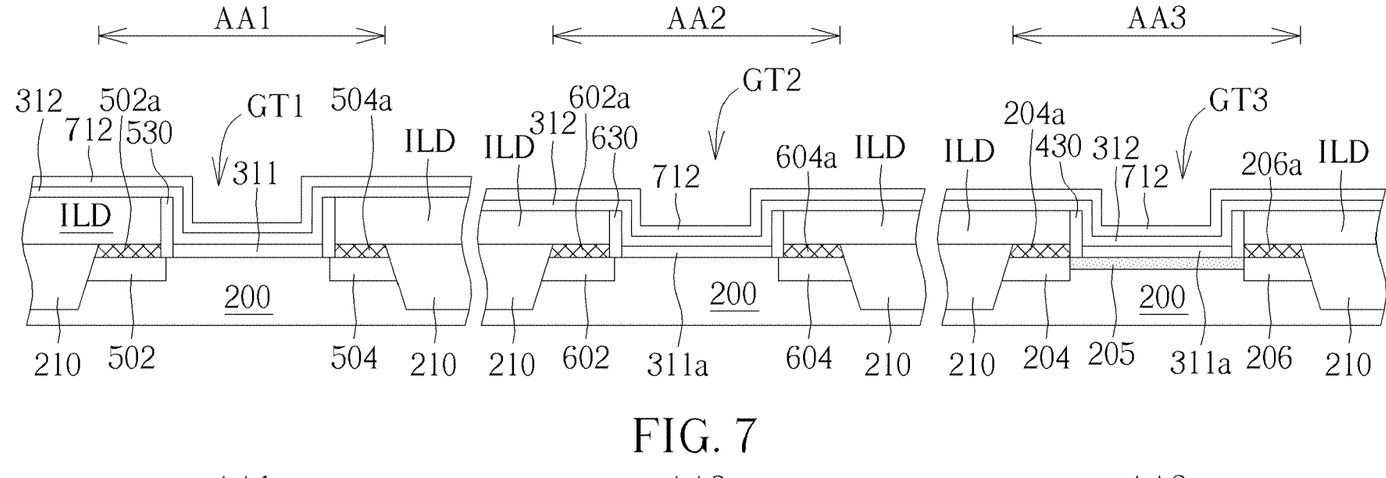

As shown in FIG. 7, a thin silicon oxide layer 311a is formed on the surface of the substrate 200 at the bottom of the gate trench GT2 and the gate trench GT3, respectively. A first high-k film 312 and a barrier layer 712 are deposited on the substrate 200 in a blanket manner. According to an embodiment of the present invention, the first high-k film 312 may include one or more high-k dielectric materials (or one or more layers of high-k dielectric materials), such as hafnium silicon oxide, hafnium oxide, aluminum oxide, zirconium oxide, lanthanum oxide, titanium oxide, yttrium oxide, strontium titanate and/or other suitable high-k dielectric materials.

Figure 8:
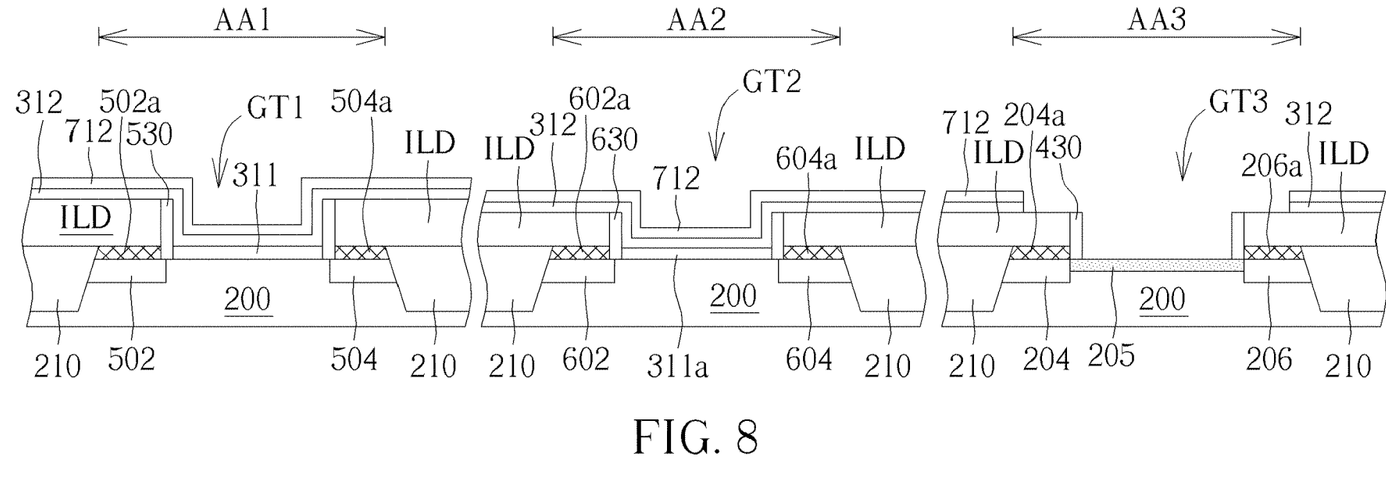

As shown in FIG. 8, the first high-k film 312, the barrier layer 712, and the silicon oxide layer 311a in the gate trench GT3 are removed to expose the diffusion region 205 in the gate trench GT3.

Figure 9:
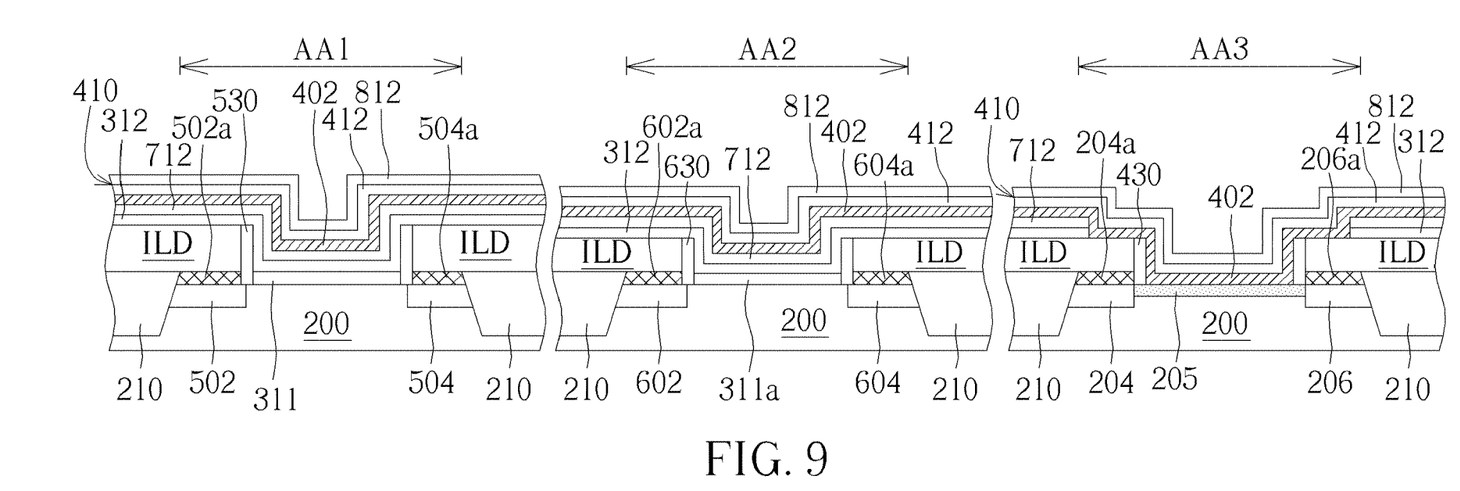

As shown in FIG. 9, a metallic film 402, a capacitor dielectric layer 410 and a barrier layer 812 are deposited on the surface of the substrate 200 in a blanket manner. The metallic film 402 is deposited conformally on the sidewall and bottom of the gate trench GT3. The metallic film 402 directly contacts the diffusion region 205. According to an embodiment of the present invention, the capacitor dielectric layer 410 includes a second high-k film 412. The composition of the second high-k film 412 may be different from the composition of the first high-k film 312. According to an embodiment of the present invention, the thickness of the second high-k film 412 may be different from the thickness of the first high-k film 312. For example, the thickness of the second high-k film 412 is greater than the thickness of the first high-k film 312.

Figure 10:
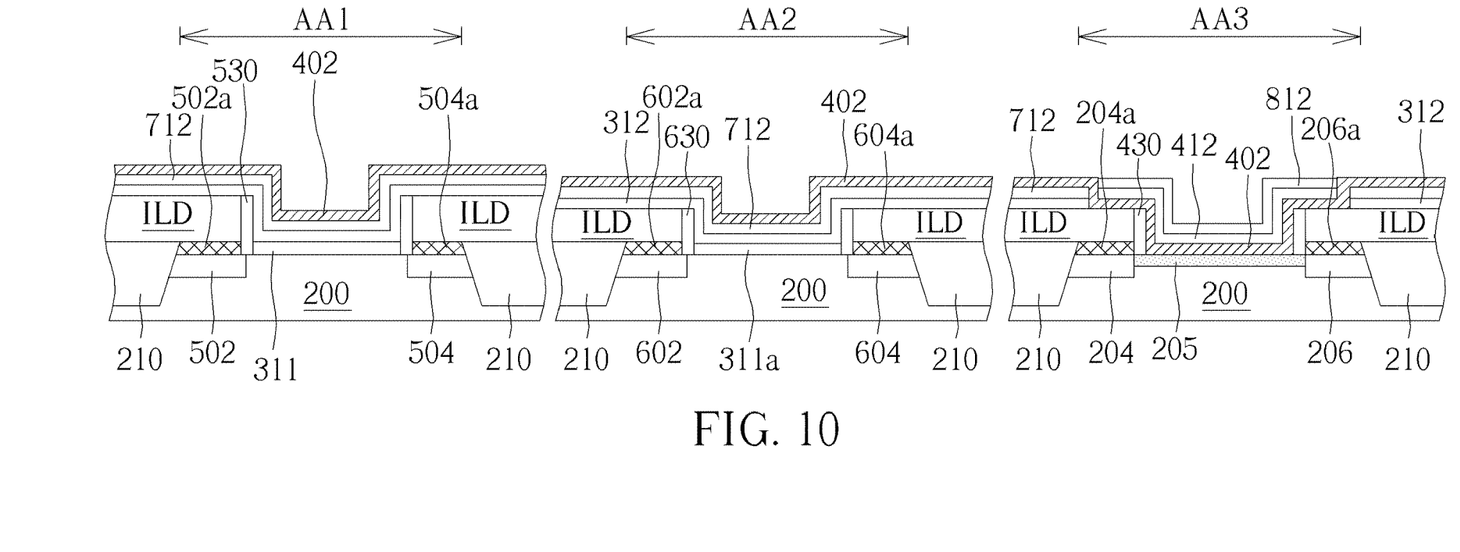

As shown in FIG. 10, an etching method can be used to remove the barrier layer 812 and the second high-k film 412 on the active area AA1 and the active area AA2, thereby exposing the metallic film 402. In the gate trench GT3, the barrier layer 812 and the second high-k film 412 are not removed.

Figure 11:
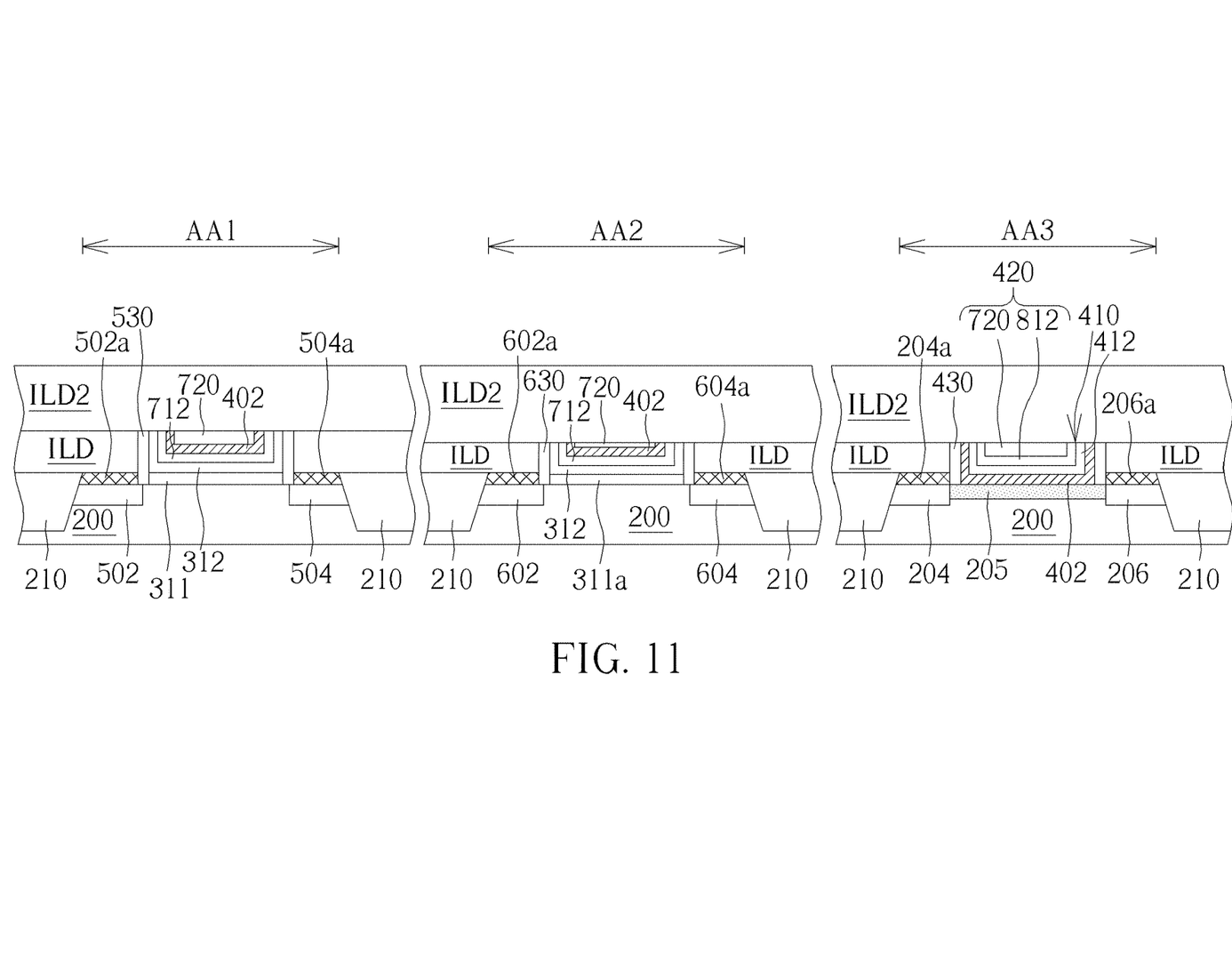

As shown in FIG. 11, the metal gate process is performed. A gate metal layer, for example, a work function layer or a low-resistance metal film, is deposited on the metallic film 402 in the active area AA1 and the active area AA2, and on the barrier layer 812 in the active area AA3. The excess metallic film 402, the barrier layer 712, and the first high-k film 312 on the dielectric layer ILD are then removed by using a chemical mechanical polishing (CMP) process, thereby exposing the dielectric layer ILD. Subsequently, a dielectric layer ILD2 is deposited in a blanket manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one-time programmable (OTP) memory cell, comprising:
   a substrate having a first conductivity type and comprising an active area surrounded by an isolation region;
   a transistor disposed on the active area; and
   a capacitor disposed on the active area and electrically coupled to the transistor, wherein the capacitor comprises a diffusion region of a second conductivity type in the substrate, a metallic film in direct contact with the active area, a capacitor dielectric layer on the metallic film, and a metal gate surrounded by the capacitor dielectric layer, wherein the diffusion region and the metallic film constitute a capacitor bottom plate.

2. The OTP memory cell according to claim 1, wherein the transistor comprises a source region of the second conductivity type in the substrate, a drain region of the second conductivity type in the substrate, a channel region in the substrate and between the source region and the drain region, and a gate electrode over the channel region.

3. The OTP memory cell according to claim 2, wherein the drain region is electrically coupled to a bit line, the gate electrode is electrically coupled to a word line, and the metal gate is electrically coupled to a source line.

4. The OTP memory cell according to claim 2, wherein the diffusion region is contiguous with the source region.

5. The OTP memory cell according to claim 2, wherein the transistor further comprises a silicon oxide layer and a first high dielectric constant film between the channel region and the gate electrode.

6. The OTP memory cell according to claim 2, wherein the gate electrode comprises metal.

7. The OTP memory cell according to claim 1, wherein the metallic film has a U-shaped profile and surrounds the capacitor dielectric layer and the metal gate.

8. The OTP memory cell according to claim 1, wherein the metallic film comprises titanium nitride.

9. The OTP memory cell according to claim 5, wherein the capacitor dielectric layer comprises a second high dielectric constant film.

10. The OTP memory cell according to claim 9, wherein the second high dielectric constant film is in direct contact with the metallic film.

11. A method of forming a one-time programmable (OTP) memory cell, comprising:
    providing a substrate having a first conductivity type and comprising an active area surrounded by an isolation region;
    forming a transistor on the active area; and
    forming a capacitor on the active area, wherein the capacitor is electrically coupled to the transistor and comprises a diffusion region of a second conductivity type in the substrate, a metallic film in direct contact with the active area, a capacitor dielectric layer on the metallic film, and a metal gate surrounded by the capacitor dielectric layer.

12. The method according to claim 11, wherein the transistor comprises a source region of the second conductivity type in the substrate, a drain region of the second conductivity type in the substrate, a channel region in the substrate and between the source region and the drain region, and a gate electrode over the channel region.

13. The method according to claim 12, wherein the drain region is electrically coupled to a bit line, the gate electrode is electrically coupled to a word line, and the metal gate is electrically coupled to a source line.

14. The method according to claim 12, wherein the diffusion region is contiguous with the source region.

15. The method according to claim 12, wherein the transistor further comprises a silicon oxide layer and a first high dielectric constant film between the channel region and the gate electrode.

16. The method according to claim 12, wherein the gate electrode comprises metal.

17. The method according to claim 11, wherein the metallic film has a U-shaped profile and surrounds the capacitor dielectric layer and the metal gate.

18. The method according to claim 11, wherein the metallic film comprises titanium nitride.

19. The method according to claim 15, wherein the capacitor dielectric layer comprises a second high dielectric constant film.

20. The method according to claim 19, wherein the high dielectric constant film is in direct contact with the metallic film.

* * * * *